United States Patent
Jang et al.

(10) Patent No.: US 10,427,944 B2
(45) Date of Patent: Oct. 1, 2019

(54) COMPOSITION FOR FORMING A SILICA BASED LAYER, SILICA BASED LAYER, AND ELECTRONIC DEVICE

(71) Applicant: SAMSUNG SDI CO., LTD., Yongin-si, Gyeonggi-do (KR)

(72) Inventors: Jun-Young Jang, Suwon-si (KR); Taek-Soo Kwak, Suwon-si (KR); Woo-Han Kim, Suwon-si (KR); Hui-Chan Yun, Suwon-si (KR); Jin-Hee Bae, Suwon-si (KR); Bo-Sun Kim, Suwon-si (KR); Yoong-Hee Na, Suwon-si (KR); Sae-Mi Park, Suwon-si (KR); Han-Song Lee, Suwon-si (KR); Wan-Hee Lim, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 3 days.

(21) Appl. No.: 14/839,642

(22) Filed: Aug. 28, 2015

(65) Prior Publication Data

US 2016/0176718 A1    Jun. 23, 2016

(30) Foreign Application Priority Data

Dec. 19, 2014 (KR) ........................ 10-2014-0184768

(51) Int. Cl.
*C01B 33/12* (2006.01)
*C09D 183/16* (2006.01)
(Continued)

(52) U.S. Cl.
CPC ............ *C01B 33/12* (2013.01); *C09D 183/16* (2013.01); *H01L 21/02126* (2013.01);
(Continued)

(58) Field of Classification Search
None
See application file for complete search history.

(56) References Cited

U.S. PATENT DOCUMENTS 3,170,962 A    2/1965 Tyler
3,453,304 A    7/1969 Selin
(Continued)

FOREIGN PATENT DOCUMENTS

CN    1260811 A    7/2000
CN    101679923 A    3/2010
(Continued)

OTHER PUBLICATIONS

TW Search Report dated May 24, 2016 for corresponding TW Application No. 104130012 (1 page).
(Continued)

*Primary Examiner* — Shamim Ahmed
*Assistant Examiner* — Bradford M Gates
(74) *Attorney, Agent, or Firm* — Lewis Roca Rothgerber Christie LLP

(57) ABSTRACT

A composition for forming a silica based layer, the composition including a silicon-containing polymer having polydispersity ranging from about 3.0 to about 30 and a solvent, and having viscosity ranging from about 1.30 centipoise (cps) to about 1.80 cps at 25° C. Also, a silica based layer is formed of the composition, and an electronic device includes the silica based layer.

16 Claims, 1 Drawing Sheet

(51) Int. Cl.
*H01L 21/02* (2006.01)
*C08G 77/62* (2006.01)
(52) U.S. Cl.
CPC .. *H01L 21/02222* (2013.01); *H01L 21/02282* (2013.01); *C08G 77/62* (2013.01)

(56) References Cited

U.S. PATENT DOCUMENTS

| | | | |
|---|---|---|---|
| 3,758,624 | A | 9/1973 | Perilstein |
| 4,975,512 | A | 12/1990 | Funayama et al. |
| 4,992,108 | A | 2/1991 | Ward et al. |
| 5,151,390 | A | 9/1992 | Aoki et al. |
| 5,354,506 | A | 10/1994 | Niebylski |
| 5,459,114 | A | 10/1995 | Kaya et al. |
| 5,688,864 | A | 11/1997 | Goodwin |
| 5,747,623 | A | 5/1998 | Matsuo et al. |
| 6,200,947 | B1 | 3/2001 | Takashima et al. |
| 6,359,096 | B1 | 3/2002 | Zhong et al. |
| 6,413,202 | B1 | 7/2002 | Leonte et al. |
| 6,451,955 | B1 | 9/2002 | Hausladen et al. |
| 6,767,641 | B1 | 7/2004 | Shimizu et al. |
| 8,058,711 | B2 | 11/2011 | Lim et al. |
| 8,252,101 | B1 | 8/2012 | Glemba et al. |
| 8,372,479 | B2 | 2/2013 | Di Loreto |
| 2002/0015851 | A1 | 2/2002 | Higuchi et al. |
| 2002/0160614 | A1* | 10/2002 | Cho ............... H01L 21/02164 438/694 |
| 2003/0092565 | A1 | 5/2003 | Chaudhari et al. |
| 2003/0105264 | A1 | 6/2003 | Bedwell et al. |
| 2004/0013858 | A1 | 1/2004 | Hacker et al. |
| 2004/0224537 | A1* | 11/2004 | Lee ............... C09D 183/16 438/782 |
| 2005/0026443 | A1* | 2/2005 | Goo ............... H01L 21/02164 438/694 |
| 2005/0181566 | A1 | 8/2005 | Machida et al. |
| 2005/0238392 | A1 | 10/2005 | Okamoto et al. |
| 2007/0049616 | A1 | 3/2007 | Ksander et al. |
| 2007/0161530 | A1 | 7/2007 | Kaneda et al. |
| 2008/0102211 | A1 | 5/2008 | Matsuo et al. |
| 2008/0234163 | A1 | 9/2008 | Shimizu et al. |
| 2010/0139697 | A1 | 6/2010 | Martens et al. |
| 2010/0167535 | A1 | 7/2010 | Nishiwaki et al. |
| 2010/0173470 | A1* | 7/2010 | Lee ............... C09D 183/02 438/427 |
| 2012/0034767 | A1 | 2/2012 | Xiao et al. |
| 2012/0064722 | A1 | 3/2012 | Sakurai |
| 2012/0164382 | A1 | 6/2012 | Yun et al. |
| 2012/0177829 | A1 | 7/2012 | Lim et al. |
| 2012/0263867 | A1 | 10/2012 | Kanbe et al. |
| 2013/0017662 | A1 | 1/2013 | Park et al. |
| 2013/0252869 | A1 | 9/2013 | Oh et al. |
| 2013/0323904 | A1* | 12/2013 | Takano ............ H01L 21/02164 438/424 |
| 2014/0057003 | A1 | 2/2014 | Johnson |
| 2014/0099510 | A1 | 4/2014 | Chiong et al. |
| 2014/0099554 | A1 | 4/2014 | Inoue et al. |
| 2014/0106576 | A1 | 4/2014 | Morita et al. |
| 2014/0120352 | A1 | 5/2014 | Miyahara et al. |
| 2014/0315367 | A1 | 10/2014 | Bae et al. |
| 2015/0093545 | A1 | 4/2015 | Han et al. |
| 2015/0234278 | A1 | 8/2015 | Hatakeyama et al. |
| 2016/0315286 | A1 | 10/2016 | Kuroki et al. |

FOREIGN PATENT DOCUMENTS

| | | |
|---|---|---|
| CN | 101111575 B | 6/2010 |
| CN | 102153951 A | 8/2011 |
| CN | 102569060 A | 7/2012 |
| CN | 102874813 A | 1/2013 |
| CN | 103380487 A | 10/2013 |
| CN | 103582559 A | 2/2014 |
| CN | 103910885 A | 7/2014 |
| JP | 05-243223 A | 9/1993 |
| JP | 10-046108 A | 2/1998 |
| JP | 10-194826 A | 7/1998 |
| JP | 10-321719 A | 12/1998 |
| JP | 2001-308090 A | 11/2001 |
| JP | 2003-197611 A | 7/2003 |
| JP | 2004-96076 A | 3/2004 |
| JP | 2004-331733 A | 11/2004 |
| JP | 3760028 B2 | 3/2006 |
| JP | 2006-253310 A | 9/2006 |
| JP | 3912697 B2 | 2/2007 |
| JP | 4101322 B2 | 3/2008 |
| JP | 2008-088224 A | 4/2008 |
| JP | 2008-305974 A | 12/2008 |
| JP | 4349390 B2 | 10/2009 |
| JP | 2010-59280 A | 3/2010 |
| JP | 2010-61722 A | 3/2010 |
| JP | 2010-177647 A | 8/2010 |
| JP | 2011-142207 A | 7/2011 |
| JP | 2012-983 A | 1/2012 |
| JP | 2012-94739 A | 5/2012 |
| JP | 5250813 B2 | 7/2013 |
| JP | 2015-58687 A | 3/2015 |
| JP | 2015-512561 A | 4/2015 |
| JP | 5691175 B2 | 4/2015 |
| KR | 2001-0006446 A | 1/2001 |
| KR | 10-2002-0025680 A | 4/2002 |
| KR | 10-0364026 B1 | 12/2002 |
| KR | 10-0397174 B1 | 9/2003 |
| KR | 10-0464859 B1 | 1/2005 |
| KR | 10-2005-0056872 A | 6/2005 |
| KR | 10-0503527 B1 | 7/2005 |
| KR | 10-2005-0084617 A | 8/2005 |
| KR | 10-2005-0104610 A | 11/2005 |
| KR | 10-0611115 B1 | 8/2006 |
| KR | 10-2006-0134098 A | 12/2006 |
| KR | 10-2007-0028518 A | 3/2007 |
| KR | 10-2007-0108214 A | 11/2007 |
| KR | 10-0859276 B1 | 9/2008 |
| KR | 10-2010-0138997 | 12/2010 |
| KR | 10-2011-0006586 A | 1/2011 |
| KR | 10-2011-0012574 A | 2/2011 |
| KR | 10-2011-0023411 | 3/2011 |
| KR | 10-2011-0062158 A | 6/2011 |
| KR | 10-2011-0073176 A | 6/2011 |
| KR | 10-2011-0081043 A | 7/2011 |
| KR | 10-1118625 | 3/2012 |
| KR | 10-1142369 B1 | 5/2012 |
| KR | 10-2012-0071311 A | 7/2012 |
| KR | 10-2013-0064026 | 6/2013 |
| KR | 10-2013-0064066 A | 6/2013 |
| KR | 10-1332306 B1 | 11/2013 |
| KR | 10-2013-0137596 | 12/2013 |
| KR | 10-2014-0011506 A | 1/2014 |
| KR | 10-2014-0063518 | 5/2014 |
| KR | 10-2014-0085119 A | 7/2014 |
| KR | 10-2014-0085264 A | 7/2014 |
| KR | 10-2014-0087644 A | 7/2014 |
| KR | 10-2014-0087998 | 7/2014 |
| KR | 10-2014-0125203 A | 10/2014 |
| KR | 10-2014-0127313 A | 11/2014 |
| KR | 10-2014-0139946 | 12/2014 |
| KR | 10-2015-0019949 A | 2/2015 |
| KR | 10-2015-0039084 | 4/2015 |
| KR | 10-2015-0039084 A | 4/2015 |
| TW | 200946453 A1 | 11/2009 |
| TW | 201132716 A | 10/2011 |
| TW | 201233741 A1 | 8/2012 |
| TW | 201439685 A | 10/2014 |
| TW | 201441365 A | 11/2014 |
| TW | 201522508 A | 6/2015 |

OTHER PUBLICATIONS

Machine English Translation of JP 3912697 B2, Feb. 9, 2007, 11 Pages.
Machine English Translation of JP 4101322 B2, Mar. 28, 2008, 9 Pages.

(56) References Cited

OTHER PUBLICATIONS

Korean Patent Abstracts for Korean Publication No. 1020040068989 A, Corresponding to Korean Patent No. 10-0859276 B1, Sep. 19, 2008, 1 Page.
KIPO Office action dated Mar. 22, 2017, corresponding to Korean Patent Application No. 10-2014-0188905 (6 pages).
KIPO Office Action dated May 1, 2017, corresponding to Korean Patent Application No. 10-2014-0184766 (5 pages).
SIPO Office Action dated Aug. 2, 2017, corresponding to Chinese Patent Application No. 201510591897.4 (8 pages).
TIPO Search Report dated Nov. 9, 2015, for corresponding Taiwanese Patent Application No. 104117087, (1 page).
TIPO Search Report dated May 24, 2016, for corresponding Taiwanese Patent Application No. 104129710 (1 page).
TIPO Search Report dated Aug. 2, 2016, for corresponding Taiwanese Patent Application No. 104125161 (1 page).
TIPO Search Report dated Sep. 7, 2016, for corresponding Taiwanese Patent Application No. 105108604 (1 page).
Partial English Translation of relevant parts of TW 201441365 A dated Nov. 1, 2014.
U.S. Office Action dated Mar. 24, 2016, for cross-reference U.S. Appl. No. 14/720,674 (13 pages).
U.S. Office Action dated Jun. 17, 2016, for cross-reference U.S. Appl. No. 14/488,440 (7 pages).
U.S. Office Action dated Aug. 12, 2016, for cross-reference U.S. Appl. No. 14/842,632 (9 pages).
U.S. Office Action dated Aug. 18, 2016, for cross-reference U.S. Appl. No. 14/754,346 (11 pages).
U.S. Office Action dated Sep. 8, 2016, for cross-reference U.S. Appl. No. 14/720,674 (24 pages).
U.S. Office Action dated Nov. 14, 2016, for cross-reference U.S. Appl. No. 14/488,440 (10 pages).
U.S. Office Action dated Dec. 15, 2016, for cross-reference U.S. Appl. No. 15/061,670 (10 pages).
U.S. Office Action dated Jan. 20, 2017, for cross reference U.S. Appl. No. 14/842,632 (7 pages).
U.S. Office Action dated Mar. 2, 2017, for cross reference U.S. Appl. No. 14/754,346 (9 pages).
U.S. Advisory Action dated May 8, 2017, issued in cross-reference U.S. Appl. No. 14/754,346 (5 pages).
U.S. Office Action dated May 8, 2017, issued in cross-reference U.S. Appl. No. 15/061,670 (10 pages).
U.S. Office Action dated Jun. 21, 2017, issued in cross-reference U.S. Appl. No. 14/754,346 (8 pages).
U.S. Office Action dated Aug. 1, 2017, issued in cross-reference U.S. Appl. No. 14/720,674 (12 pages).
U.S. Office Action dated Sep. 14, 2017, issued in cross-reference U.S. Appl. No. 15/061,670 (8 pages).
U.S. Office Action dated Sep. 21, 2017, issued in cross-reference U.S. Appl. No. 14/842,632 (6 pages).
KIPO Office Action dated May 1, 2017, for corresponding Korean Patent Application No. 10-2014-0184768 (5 pages).
Korean Notice of Allowance dated Jan. 17, 2018, corresponding to Korean Patent Application No. 10-2014-0184766 (3 pages).
U.S. Final Office Action dated Jan. 26, 2018, issued in U.S. Appl. No. 15/061,670 (6 pages).
U.S. Office Action dated Feb. 7, 2018, issued in U.S. Appl. No. 14/754,346 (9 pages).
Chinese Office Action dated Jan. 2, 2018, for corresponding Chinese Patent Application No. 201510574210.6 (7 pages).
Korean Notice of Allowance dated Feb. 2, 2018, for corresponding Korean Patent Application No. 10-2014-0184768 (3 pages).
U.S. Notice of Allowance dated Mar. 7, 2018, issued in U.S. Appl. No. 14/720,674 (9 pages).
KIPO Notice of Allowance dated Oct. 27, 2017, corresponding to Korean Patent Application No. 10-2014-0188905 (3 pages).
KIPO Office Action dated Nov. 13, 2017, corresponding to Korean Patent Application No. 10-2015-0109028 (6 pages).
U.S. Notice of Allowance dated Nov. 20, 2017, issued in U.S. Appl. No. 14/720,674 (8 pages).
Heemken et al., "Comparison of ASE and SFE with Soxhlet, Sonication, and Methanolic Saponification Extractions for the Determination of Organic Micropollutants in Marine Particulate Matter," Analytical Chemistry, vol. 69, No. 11, Jun. 1, 1997, pp. 2171-2180.
TIPO Search Report dated Sep. 7, 2016, corresponding to Taiwanese Patent Application No. 105108604 (1 page).
U.S. Office Action dated Nov. 3, 2017, for U.S. Appl. No. 14/754,346 (8 pages).
KIPO Office Action dated Aug. 21, 2017, corresponding to Korean Patent Application No. 10-2015-0079441 (9 pages).
Chinese Search Report from the SIPO Office Action dated Dec. 19, 2017, corresponding to Chinese Patent Application No. 201510452174.6 (2 pgs).

* cited by examiner

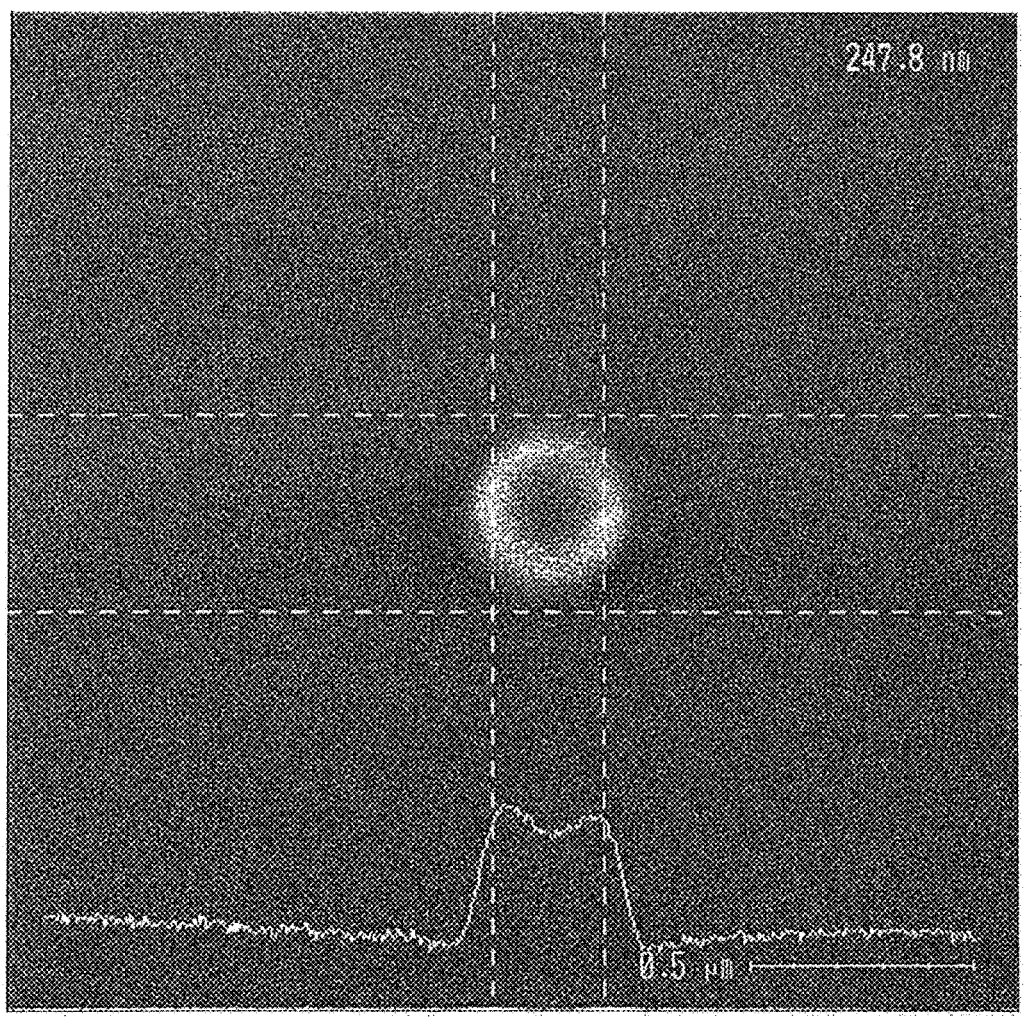

COMPOSITION FOR FORMING A SILICA BASED LAYER, SILICA BASED LAYER, AND ELECTRONIC DEVICE

CROSS-REFERENCE TO RELATED APPLICATION

This application claims priority to and the benefit of Korean Patent Application No. 10-2014-0184768, filed in the Korean Intellectual Property Office on Dec. 19, 2014, the entire content of which is incorporated herein by reference.

BACKGROUND

1. Field

This disclosure relates to a composition for forming a silica based layer, a silica based layer, and an electronic device including the silica based layer.

2. Description of the Related Art

In the development of semiconductor technology, researches on a semiconductor memory cell with high integration and high speed have been made in order to increase integration in a smaller semiconductor chip and improve performance. However, because the semiconductor requires high integration, and a space between wires becomes narrower, a RC delay, a cross-talk, deterioration of a response speed and the like may occur and thus, cause a problem in terms of a semiconductor interconnection. In order to solve this problem, appropriate isolation (separation) among devices may be needed. Accordingly, the appropriate isolation (separation) among devices is performed by widely using a silica based layer formed of a silicon-containing material as an interlayer insulating layer of a semiconductor device, a planarization layer, a passivation film, an insulation layer among devices and/or the like. The silica based layer is used as a protective layer, an insulation layer and/or the like for a display device and/or the like as well as the semiconductor device. For example, Korean Patent Laid-Open No. 2002-0025680 discloses a semiconductor device including a silicon nitride layer, Korean Patent Laid-Open No. 2005-0104610 discloses a display device including an insulation layer as a silicon layer, and the entire content of each of which is incorporated herein by reference. In general, the silica based layer is formed by coating a silicon-containing material in a set or predetermined region of a device and curing it, and herein, a defect may be generated on the silica based layer by a bubble generated during preparation of the silicon-containing material and its coating. Thereby, the yield of the silica based layer is decreased, and thus, the manufacturing cost of the device may be increased.

SUMMARY

An aspect of an embodiment is directed toward a composition for forming a silica based layer being capable of providing a film having excellent planarization characteristics.

Another aspect of an embodiment is directed toward a silica based layer using the composition for forming a silica based layer.

Yet another aspect of an embodiment is directed toward an electronic device including the silica based layer.

One embodiment provides a composition for forming a silica based layer including a silicon-containing polymer having polydispersity ranging from about 3.0 to about 30 and a solvent, and having viscosity ranging from about 1.30 centipoise (cps) to about 1.80 cps when measured at a measurement temperature of 25° C. In one embodiment, the viscosity is measured under the following conditions:

Viscosity Measurement Condition
Viscometer: LVDV-III (BROOKFIELD);
Spindle No.: SP-40;
Torque/RPM: 30-60% Torque/50 RPM; and
Measurement Temperature (sample cup temperature): 25° C.

The silicon-containing polymer may have a weight average molecular weight of about 4,000 to about 160,000.

The silicon-containing polymer may have a weight average molecular weight of about 20,000 to about 160,000.

The silicon-containing polymer may include polysilazane, polysiloxazane or a combination thereof.

The solvent may include at least one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, and a combination thereof.

An amount of the silicon-containing polymer may be about 0.1 to about 30 wt % based on the total amount of the composition for forming a silica based layer.

According to another embodiment, a silica based layer manufactured from the composition for forming a silica based layer is provided.

According to yet another embodiment, an electronic device including the silica based layer is provided.

The silica based layer according to one or more embodiments is capable of reducing or minimizing generation of a defect generated on its surface and/or capable of having no generation of a bead on its edge.

BRIEF DESCRIPTION OF THE DRAWING

The drawing is a scanning electron microscope (SEM) photograph showing whether a bead is generated on the edge of a thin film formed of a composition for forming a silica based layer according to Comparative Example 1.

DETAILED DESCRIPTION

Exemplary embodiments of the present invention will hereinafter be described in more detail, and may be easily performed by those who have common knowledge in the related art. However, this disclosure may be embodied in many different forms and is not construed as limited to the exemplary embodiments set forth herein.

Hereinafter, a composition for forming a silica based layer according to one embodiment is illustrated.

The composition for forming a silica based layer according to one embodiment includes a silicon-containing polymer and a solvent.

The silicon-containing polymer may include any polymer including a silicon (Si) atom and having polydispersity within the range without a particular limit; for example, the polymer may be polysilazane, polysiloxazane or a combination thereof.

The polydispersity of the silicon-containing polymer may be in a range of about 3.0 to about 30 and specifically, according to one embodiment, in a range of about 5.0 to about 20.

The composition for forming a silica based layer may have viscosity ranging from about 1.30 centipoise (cps) to about 1.80 cps and specifically, according to one embodiment, from about 1.40 cps to about 1.80 cps.

According to one embodiment, the composition for forming a silica based layer uses a silicon-containing polymer having polydispersity within a set or predetermined range and controls viscosity within a set or predetermined range and thus, may reduce or minimize generation of bubbles during the coating. Accordingly, the composition may secure uniformity of a layer.

In some embodiments, the composition for forming a silica based layer may have viscosity ranging from about 1.40 cps to about 1.80 cps (measured at 25° C.), but the present invention is not limited thereto.

In the described embodiments, the viscosity is measured under the following conditions:
Viscometer: LVDV-III (BROOKFIELD);
Spindle No.: SP-40;
Torque/RPM: 30-60% Torque/50 RPM; and
Measurement temperature (sample cup temperature): 25° C. However, the present invention is not limited thereto.

For example, the silicon-containing polymer may have a weight average molecular weight ranging from about 4,000 to about 160,000. In one embodiment, the silicon-containing polymer has a weight average molecular weight ranging from about 20,000 to about 160,000.

Accordingly, a composition including the silicon-containing polymer having a weight average molecular weight and polydispersity within the ranges may secure excellent etching characteristics as well as have excellent coating property and thus, form a uniform layer.

For example, the silicon-containing polymer may be hydrogenated polysiloxazane or hydrogenated polysilazane.

The hydrogenated polysiloxazane or the hydrogenated polysilazane may have an oxygen content ranging from about 0.2 wt % to about 3 wt % based on 100 wt % of the hydrogenated polysiloxazane or the hydrogenated polysilazane.

When the hydrogenated polysiloxazane or the hydrogenated polysilazane are included within the ranges, the composition may be prevented from contraction during the heat treatment and thus, from generation of a crack in a filling pattern formed thereof. More specifically, the hydrogenated polysiloxazane or the hydrogenated polysilazane may be included in a range of about 0.4 to about 2 wt %.

In addition, the hydrogenated polysiloxazane or hydrogenated polysilazane may include a moiety represented by —$SiH_3$ at the terminal end, and the —$SiH_3$ group content of the hydrogenated polysiloxazane or hydrogenated polysilazane may range from about 15% to about 40% based on the total amount of a Si—H bond in hydrogenated polysiloxazane or hydrogenated polysilazane. In the present specification, the oxygen content is measured by using FlashEA 1112 (Thermo Fisher Scientific Inc.), and the $SiH_3$/SiH ratio is measured by using proton NMR of 200 MHz: AC-200 (Bruker Corp.).

The hydrogenated polysiloxazane or hydrogenated polysilazane may be included in an amount of about 0.1 to about 30 wt % based on the total amount of the composition for forming a silica based layer. When the hydrogenated polysiloxazane or the hydrogenated polysilazane is included within the range, the composition may maintain appropriate viscosity and form a flat and uniform layer without a void during the gap-fill.

The solvent may use an aromatic compound, an aliphatic compound, a saturated hydrocarbon compound, ethers, esters, ketones, and the like, and may be specifically selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, and a combination thereof.

In particular, at least one of the solvents has a high boiling point of greater than or equal to 130° C. Accordingly, flatness of a layer may be increased.

The solvent may be included in a balance amount except for the components based on the total weight of the composition for forming a silica based layer.

The composition for forming a silica based layer may further include a thermal acid generator (TAG).

The thermal acid generator may include any compound without particular limit, if it generates acid ($H^+$) by heat. In particular, it may include a compound activated at 90° C. or higher and generating sufficient acid and also, having low volatility. Such a thermal acid generator may be, for example selected from nitrobenzyl tosylate, nitrobenzyl benzenesulfonate, phenol sulfonate, and a combination thereof.

The thermal acid generator may be included in an amount of about 0.01 to about 25 wt % based on the total amount of the composition for forming a silica based layer.

The composition for forming a silica based layer may further include a surfactant.

The surfactant is not particularly limited, and may be, for example a non-ionic surfactant such as polyoxyethylene alkyl ethers (such as polyoxyethylene lauryl ether, polyoxyethylene stearyl ether, polyoxyethylene cetyl ether, polyoxyethylene oleyl ether, and/or the like), polyoxyethylene alkylallyl ethers (such as polyoxyethylenenonyl phenol ether, and/or the like), polyoxyethylene•polyoxypropylene block copolymers, polyoxyethylene sorbitan fatty acid ester (such as sorbitan monolaurate, sorbitan monopalmitate, sorbitan monostearate, sorbitan monoleate, polyoxyethylene sorbitan monostearate, polyoxyethylene sorbitan trioleate, polyoxyethylene sorbitan tristearate, and/or the like); a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and/or the like; and/or other silicone-based surfactant (such as a organosiloxane polymer KP341 (Shin-Etsu Chemical Co., Ltd.), and/or the like).

The surfactant may be included in an amount of about 0.001 to about 10 wt % based on the total amount of the composition for forming a silica based layer. Within the range, dispersion of a solution and simultaneously, uniform thickness and filling properties of a layer may be improved.

According to another embodiment, a silica based layer manufactured using the composition for forming a silica based layer is provided.

The silica based layer may be, for example an insulation layer, a filling layer, a protective layer (such as a hard coating and/or the like), a semiconductor capacitor, and/or the like. The insulation layer may be used, for example between a transistor device and a bitline, between a transistor device and a capacitor, without limitation.

According to another embodiment, an electronic device including the silica based layer is provided. The electronic device may include a display device, a semiconductor, an image sensor, and/or the like.

According to another embodiment, a silica based layer manufactured using the composition for forming a silica based layer is provided.

The method of manufacturing a silica based layer includes coating the composition for forming a silica based layer on a substrate; drying the substrate coated with the composition to produce a resultant; and curing the resultant.

The composition for forming a silica based layer may be in form of a solution including the silicon-containing polymer and a solvent, and may be coated using a solution process, for example spin coating, slit coating, screen printing, inkjet, ODF (one drop filling) or a combination thereof. The curing process of the substrate may include heat-treating at a temperature, for example about 150° C. or greater.

Hereinafter, the following examples illustrate embodiments of the present invention in more detail. However, these embodiments are exemplary, and the present disclosure is not limited thereto.

Preparation of Composition for Forming a Silica Based Layer

Example 1

Dry nitrogen was substituted inside a 2 L reactor equipped with an agitator and a temperature controller. Then, 2.0 g of pure water was injected into 1,500 g of dry pyridine and then, sufficiently mixed therewith, and the mixture was put in the reactor and kept warm at 5° C. Subsequently, 100 g of dichlorosilane was slowly injected thereinto over one hour. Then, 70 g of ammonia was injected thereinto over 3 hours while the mixture was agitated. Subsequently, dry nitrogen was injected thereinto for 30 minutes, and the ammonia remaining in the reactor was removed.

The obtained white slurry product was filtered through a 1 μm polytetrafluoroethylene (Teflon) filter under a dry nitrogen atmosphere, thereby obtaining 1,000 g of a filtered solution. Then, 1,000 g of dry xylene was added thereto, and the mixture was adjusted to have a solid concentration of 20% by repeating a solvent exchange of xylene for pyridine for three times by using a rotary evaporator and then, filtered with a polytetrafluoroethylene (Teflon) filter having a pore size of 0.03 μm.

Lastly, the resultant was adjusted to have a solid concentration of 20% by repeating a solvent exchange of di-n-butylether for the xylene while dry di-n-butylether having moisture of less than or equal to 5 ppm was added thereto for three times by using the rotary evaporator and then, filtered with a polytetrafluoroethylene (Teflon) filter having a pore size of 0.03 μm. The weight average molecular weight of the product was measured by using GPC; HPLC Pump 1515, RI Detector 2414 (Waters Corp.) and Column: LF804 (Shodex).

Through the process, polysilazane having a weight average molecular weight of 23000 and a polydispersity index of 13.6 was obtained. In the present specification, the weight average molecular weight and the polydispersity of the polysilazane were respectively measured by using GPC (RID detector 2414, Waters Corp.) and Column: LF804 (Shodex). Then, 20 g of the polysilazane was dissolved in 109 g of DBE (a solvent), and the solution was filtered, thereby preparing a composition for forming a silica based layer (a compound content: 18.3 wt %).

Subsequently, viscosity of the composition for forming a silica based layer was measured by using a viscometer (LVDV-III, Brookfield) under the above viscosity measurement condition, and the viscosity was 1.60 cps.

Example 2

Polysilazane having a weight average molecular weight of 37,000 and polydispersity of 11.7 was obtained through the process. 20 g of the obtained polysilazane was dissolved in 114 g of DBE (a solvent), and the solution was filtered, thereby obtaining a composition for forming a silica based layer (a compound content: 17.5 wt %).

Subsequently, viscosity of the composition for forming a silica based layer was measured in the same method as Example 1, and the viscosity was 1.50 cps.

Example 3

Polysilazane having a weight average molecular weight of 45000 and polydispersity of 10.3 was obtained through the process. 20 g of the polysilazane was dissolved in 123 g of DBE (a solvent), and the solution was filtered, thereby preparing a composition for forming a silica based layer (a compound content: 16.2 wt %).

Subsequently, viscosity of the composition for forming a silica based layer was measured in the same method as Example 1, and the viscosity was 1.40 cps.

Example 4

Polysilazane having a weight average molecular weight of 61000 and polydispersity of 7.0 through the process. 20 g of the polysilazane was dissolved in 130 g of DBE (a solvent), thereby preparing a composition for forming a silica based layer (a compound content: 15.4 wt %).

Subsequently, viscosity of the composition for forming a silica based layer viscosity was measured in the same method as Example 1, and the viscosity was 1.35 cps.

Comparative Example 1

Polysilazane having a weight average molecular weight of 100000 and polydispersity of 17.7 was obtained through the process.

Subsequently, 20 g of the polysilazane was dissolved in 132 g of DBE (a solvent), and the solution was filtered, thereby preparing a composition for forming a silica based layer (a compound content: 15.1 wt %).

Subsequently, viscosity of the composition for forming a silica based layer was measured in the same method as Example 1, and the viscosity was 1.90 cps.

Comparative Example 2

Polysilazane having a weight average molecular weight of 8000 and polydispersity of 2.9 was obtained through the process. 20 g of the polysilazane was dissolved in 107 g of DBE (a solvent), and the solution was filtered, thereby obtaining a composition for forming a silica based layer (a compound content: 18.7 wt %).

Subsequently, viscosity of the composition for forming a silica based layer was measured in the same method as Example 1, and the viscosity was 1.25 cps.

Evaluation 1: Characteristics of Layer Surfaces

Each composition for forming a silica based layer according to Examples 1 to 4 and Comparative Examples 1 and 2 was respectively spin-on coated to form a 5,500 Å-thick thin film on a silicon wafer having a diameter of 8 inches and then, baked at 150° C. for 130 seconds. Subsequently, a scanning electron microscope (SEM) was used to examine whether a bead was generated or not on the edge of the thin film and how many defects were on the surface of the thin film, and herein, the defects having a diameter of greater than or equal to 175 nm were counted.

The results are provided in Table 1, and the drawing provides a scanning electron microscope (SEM) showing that a bead was generated on the edge of the thin film formed of the composition for forming a silica based layer according to Comparative Example 1.

TABLE 1

|  | Polydispersity | Viscosity (cps) | Beads generation | Number of defects |
|---|---|---|---|---|
| Example 1 | 13.6 | 1.60 | No | 970 |
| Example 2 | 11.7 | 1.50 | No | 680 |
| Example 3 | 10.3 | 1.40 | No | 810 |
| Example 4 | 7.0 | 1.35 | No | 520 |
| Comparative Example 1 | 17.7 | 1.90 | Yes | 2700 |
| Comparative Example 2 | 2.9 | 1.25 | Yes | 2210 |

Referring to Table 1 and the drawing, each thin film respectively formed of the compositions for forming a silica based layer according to Examples 1 to 4 showed no bead on the edge, while each thin film respectively formed of the compositions for forming a silica based layer according to Comparative Examples 1 and 2 showed no bead on the edge.

In addition, referring to Table 1, each thin film respectively formed of the compositions for forming a silica based layer according to Examples 1 to 4 showed the sharply decreased number of the defects compared with each thin film respectively formed of the compositions for forming a silica based layer according to Comparative Examples 1 and 2.

Accordingly, a silica based layer formed of a composition for forming a silica based layer satisfying the set or predetermined viscosity and the set or predetermined polydispersity showed excellent planarization characteristics.

As used herein, the term "and/or" includes any and all combinations of one or more of the associated listed items. Expressions such as "at least one of" or "at least one selected from" when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration. As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, and 35 U.S.C. § 132(a).

As used herein, the term "substantially," "about," and similar terms are used as terms of approximation and not as terms of degree, and are intended to account for the inherent deviations in measured or calculated values that would be recognized by those of ordinary skill in the art.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A composition for forming a silica based layer, the composition comprising polysilazane having polydispersity ranging from about 7.0 to about 13.6 and a solvent, and
    having viscosity ranging from about 1.35 centipoise (cps) to about 1.60 cps when measured at a measurement temperature of 25° C.

2. The composition of claim 1, wherein the polysilazane has a weight average molecular weight of about 4,000 to about 160,000.

3. The composition of claim 1, wherein the polysilazane has a weight average molecular weight of about 20,000 to about 160,000.

4. The composition of claim 1, wherein the solvent comprises at least one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, and a combination thereof.

5. The composition of claim 1, wherein an amount of the polysilazane is about 0.1 to about 30 wt % based on the total amount of the composition.

6. The composition of claim 1, wherein the polysilazane comprises hydrogenated polysilazane.

7. A silica based layer manufactured from the composition of claim 1.

8. An electronic device comprising the silica based layer of claim 7.

9. A method of manufacturing a silica based layer, the method comprising:
    coating the composition of claim 1 on a substrate;
    drying the coated substrate with the composition to produce a resultant; and
    curing the resultant.

10. The method of claim 9, wherein the polysilazane has a weight average molecular weight of about 4,000 to about 160,000.

11. The method of claim 9, wherein the polysilazane has a weight average molecular weight of about 20,000 to about 160,000.

12. The method of claim 9, wherein the solvent comprises at least one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, and a combination thereof.

13. The method of claim 9, wherein an amount of the polysilazane is about 0.1 to about 30 wt % based on the total amount of the composition.

14. The method of claim 9, wherein the polysilazane comprises hydrogenated polysilazane.

15. An electronic device comprising a silica based layer manufactured according to the method of claim 9.

16. An electronic device comprising a silica based layer, the silica based layer being a derivative of the composition of claim 1.

* * * * *